(12) United States Patent
Aomoto

(10) Patent No.: US 12,043,498 B2
(45) Date of Patent: Jul. 23, 2024

(54) OVERHEAD CARRIER VEHICLE AND OVERHEAD CARRIER VEHICLE SYSTEM

(71) Applicant: MURATA MACHINERY, LTD., Kyoto (JP)

(72) Inventor: Kazuya Aomoto, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 339 days.

(21) Appl. No.: 17/636,046

(22) PCT Filed: Jun. 24, 2020

(86) PCT No.: PCT/JP2020/024862
§ 371 (c)(1),
(2) Date: Feb. 17, 2022

(87) PCT Pub. No.: WO2021/039077
PCT Pub. Date: Mar. 4, 2021

(65) Prior Publication Data
US 2022/0332522 A1    Oct. 20, 2022

(30) Foreign Application Priority Data
Aug. 28, 2019 (JP) .................. 2019-155943

(51) Int. Cl.
*B65G 47/90* (2006.01)
*B65G 1/04* (2006.01)

(52) U.S. Cl.
CPC .......... *B65G 47/90* (2013.01); *B65G 1/0464* (2013.01)

(58) Field of Classification Search
CPC ........ G65G 47/00; G65G 47/74; G65G 47/90; B65G 1/00; B65G 1/04; B65G 1/0464
See application file for complete search history.

(56) References Cited

U.S. PATENT DOCUMENTS

| 8,088,203 B2 * | 1/2012 | Matsuba | H01L 21/67017 96/417 |
| 2017/0015507 A1 | 1/2017 | Min et al. | |
| 2018/0122656 A1 * | 5/2018 | Murakami | B66C 1/663 |

FOREIGN PATENT DOCUMENTS

| JP | 2006-315813 A | 11/2006 |
| KR | 10-2005-0028447 A | 3/2005 |

* cited by examiner

Primary Examiner — Nguyen Q. Ha
(74) Attorney, Agent, or Firm — Keating & Bennett, LLP

(57) ABSTRACT

An overhead transport vehicle includes a traveler capable of traveling along a track, and an elevator including a chuck to grip a FOUP and capable of being lifted and lowered with respect to the traveler. The overhead transport vehicle includes a body controller provided in the body to control portions and operations of the overhead transport vehicle, a vibration detector provided in the elevator to detect vibration generated in the elevator, and a vibration monitor provided in the elevator to determine whether a result of vibration detected by the vibration detector is within a permissible range and also output a result of the determining to the body controller.

18 Claims, 5 Drawing Sheets

OVERHEAD CARRIER VEHICLE AND OVERHEAD CARRIER VEHICLE SYSTEM

BACKGROUND OF THE INVENTION

1. Field of the Invention

Aspects of the present invention relates to an overhead transport vehicle and an overhead transport vehicle system.

2. Description of the Related Art

An overhead transport vehicle including a body unit capable of traveling along a track, and a lifting unit including a gripping part configured to grip an article and configured to ascend and descend with respect to the body unit by winding and paying out a plurality of suspending members is known. For this overhead transport vehicle, there is such a need that vibration generated in an article gripped by the lifting unit can be monitored with a simple configuration. For example, Japanese Unexamined Patent Publication No. 2006-315813 discloses a diagnostic system in which an overhead transport vehicle is provided with a vibration sensor, and vibration detected by a vibration sensor is transmitted together with the output torques and the numbers of revolutions, for example, of a traveling motor and a lifting motor to a diagnostic device provided outside the overhead transport vehicle, whereby the diagnostic device can automatically diagnose the overhead transport vehicle.

SUMMARY OF THE INVENTION

However, because this conventional diagnostic system needs to be provided with the diagnostic device configured to perform advanced analysis and diagnosis based on various types of information transmitted from the overhead transport vehicle, the requirement that vibration generated in an article gripped by the lifting unit can be grasped with a simple configuration cannot be satisfied. Furthermore, because this conventional diagnostic system is configured to transmit vibration information acquired by the vibration sensor without processing it and also transmit the output torques and the numbers of revolutions, a processing load including communication in a body control unit equipped on the overhead transport vehicle increases.

Preferred embodiments of the present invention provide overhead transport vehicles and overhead transport vehicle systems that each can monitor vibration generated in an article gripped by an elevator with a simple configuration without increasing a processing load in a body controller on the overhead transport vehicle.

An overhead transport vehicle according to one aspect of a preferred embodiment of the present invention is an overhead transport vehicle including a body capable of traveling along a track and an elevator to be ascend and descend with respect to the body and including a gripper to grip an article. The overhead transport vehicle includes a body controller provided in the body to control portions or operations of the overhead transport vehicle, a vibration detector provided in the elevator to detect vibration generated in the elevator, and a vibration monitor provided in the elevator to determine whether a result of the vibration detected by the vibration detector is within a predetermined permissible range and also output a result of the determining to the body controller.

In this configuration, only the result of determining whether the result of the detected vibration has exceeded the predetermined permissible range is output from the vibration monitor to the body controller. Thus, the processing load in the body controller can be reduced more than in a configuration in which all of detection results detected by the vibration detector are output to the body controller. Furthermore, in this configuration, whether the detected vibration is within the predetermined permissible range is simply determined, and thus vibration generated in an article can be monitored with a simple configuration without performing advanced analysis and the like. Consequently, vibration generated in an article gripped by the elevator can be monitored with a simple configuration without increasing processing load in the body controller on the overhead transport vehicle.

In an overhead transport vehicle according to one aspect of a preferred embodiment of the present invention, the body controller may set the permissible range for the vibration monitor. By this configuration, the permissible range for determination on abnormal vibration can be easily set.

In an overhead transport vehicle according to one aspect of a preferred embodiment of the present invention, the vibration monitor may output a notice of excess to the body controller when vibration detected by the vibration detector has exceeded the permissible range. In this configuration, only when vibration detected by the vibration detector has been determined to have exceeded the permissible range, that is, only when abnormal vibration has been determined to have been detected, the vibration monitor outputs the notice of excess to the body controller, and thus the processing load in the body controller can be further reduced.

In an overhead transport vehicle according to one aspect of a preferred embodiment of the present invention, the vibration monitor may output, to the body controller, at least one of a result of determination on the vibration during traveling and a result of determination on the vibration during lifting or lowering of the article. In this configuration, it is possible to monitor at least one of abnormal vibration when the overhead transport vehicle is traveling and abnormal vibration when the elevator is performing lifting or lowering operation while the overhead transport vehicle stops.

In an overhead transport vehicle according to one aspect of a preferred embodiment of the present invention, the vibration monitor may be able to set a plurality of permissible ranges that are switchable depending on an operational state of the overhead transport vehicle. This operational state includes a state during traveling on a straight track, a state during traveling on a curved track, and a state during lifting or lowering of an article, for example. In this configuration, abnormal vibration depending on the operational state of the overhead transport vehicle can be suitably detected.

An overhead transport vehicle system according to one aspect of a preferred embodiment of the present invention includes a plurality of the overhead transport vehicles described above, and a state monitor capable of communicating with the body controller of each of the overhead transport vehicles. The state monitor may store a result of determination performed by the vibration monitor and a position on the track in an associated manner and also output information in which the result of the determination is superimposed on map data representing an arrangement of the track. In this configuration, abnormal vibration (indicating that vibration has exceeded the permissible range) and the position where the abnormal vibration has been generated are stored so as to be associated with each other, and thus the location where the abnormal vibration has been generated can be easily grasped. Furthermore, the position where the abnormal vibration has been generated is displayed in a manner superimposed on the map data, and thus the position where the abnormal vibration has been generated can be visually identified.

According to various preferred embodiments of the present invention, vibration generated in an article gripped by an elevator can be monitored with a simple configuration without increasing the processing load in the body controller on each overhead transport vehicle.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will now be described in detail with reference to the drawings. In description of the drawings, like elements are designated by like reference signs, and duplicate description is omitted.

Figure 1:
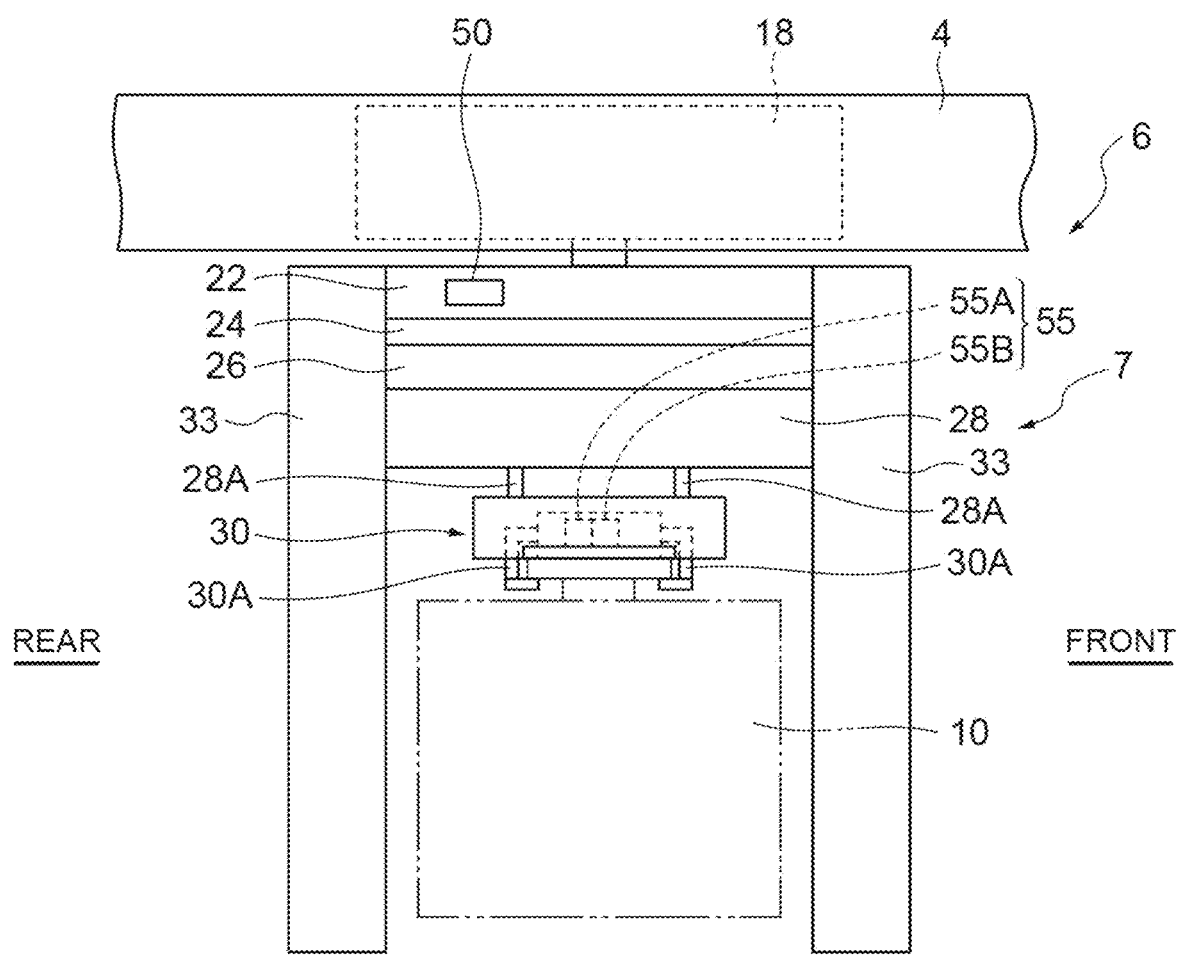
FIG. 1 is a side view illustrating an overhead transport vehicle including a transfer device according to a preferred embodiment of the present invention.
Figure 2:
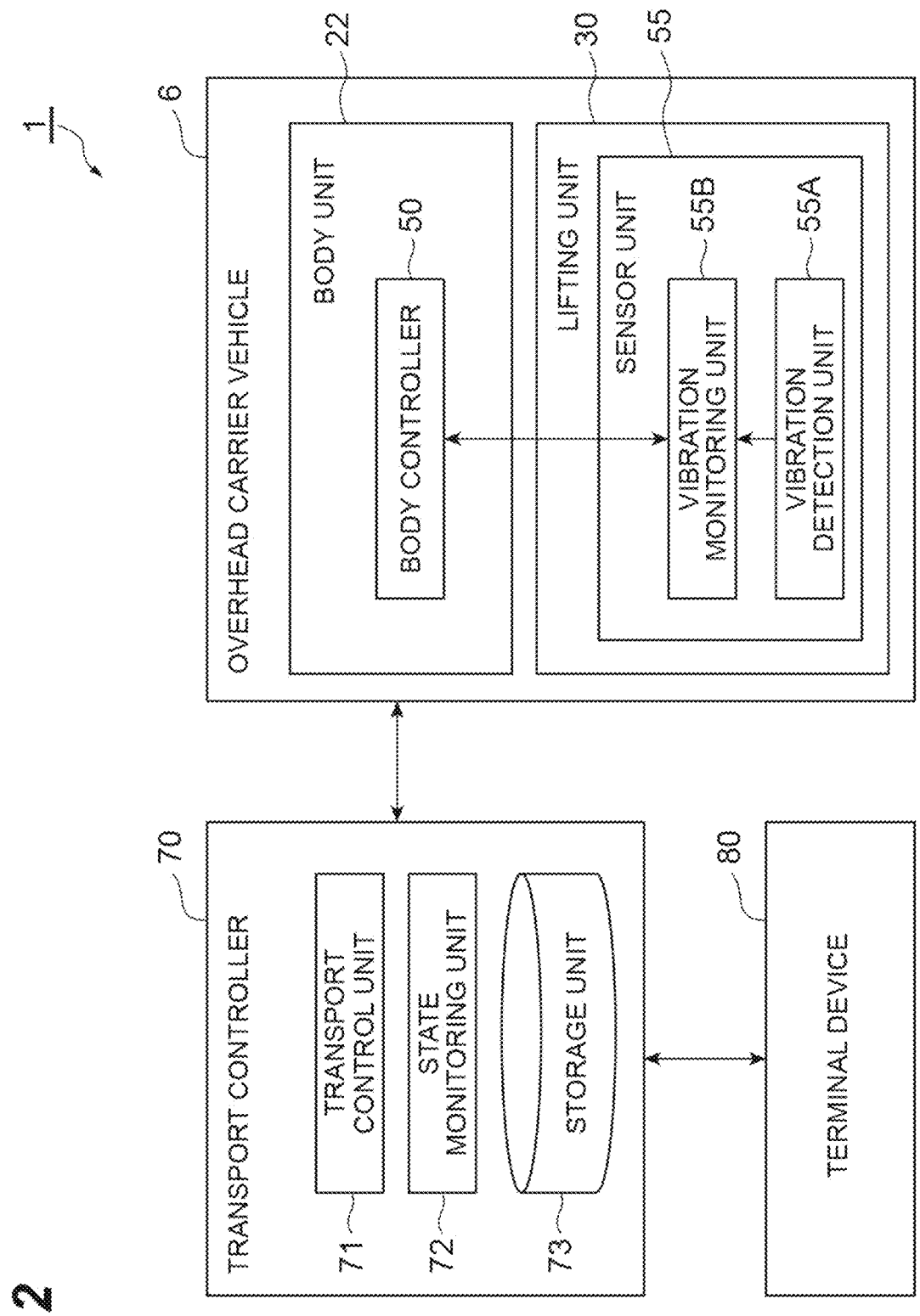
FIG. 2 is a block diagram illustrating a functional configuration of the overhead transport vehicle in FIG. 1.

An overhead transport vehicle system 1 according to a preferred embodiment of the present invention includes a plurality of overhead transport vehicles 6 (see FIG. 1), a track 4, and a transport controller 70 (see FIG. 2).

As illustrated in FIG. 1, each overhead transport vehicle 6 according to the present preferred embodiment is an overhead transport vehicle movable along a track 4, and is used for a system configured to carry a front opening unified pod (FOUP) (article) between placement units (not illustrated). The overhead transport vehicle 6 may carry a container such as a reticle pod configured to store a plurality of glass substrates and also a general part, for example, instead of the FOUP 10. The following describes an example of the overhead transport vehicles 6 used in the overhead transport vehicle system 1 in which the overhead transport vehicles 6 travel along the one-way track 4 installed on, for example, a ceiling of a factory.

The track 4 is installed near the ceiling in a space overhead of an operator, for example. The track 4 is suspended from the ceiling, for example. The track 4 is a predetermined traveling path for the overhead transport vehicles 6 to travel. Placement units are disposed along the track 4, and are provided at positions where each overhead transport vehicle 6 can deliver or receive a FOUP 10. Each placement unit includes a buffer and a delivery port. The buffer is a placement unit on which a FOUP 10 is temporarily placed. For example, the buffer is a placement unit on which a FOUP 10 being carried by an overhead transport vehicle 6 is temporarily put when the FOUP 10 cannot be transferred onto a delivery port as a destination for the reason that, for example, another FOUP 10 has been placed on the delivery port. The delivery port is a placement unit to deliver and receive a FOUP 10 to and from a semiconductor processing device (not illustrated) including cleaning equipment, deposition equipment, lithography equipment, etching equipment, thermal treatment equipment, and planarization equipment. Herein, the processing device is not limited to a particular one, and may be a device of various types.

Each overhead transport vehicle 6 travels along the track 4 to carry a FOUP 10. The overhead transport vehicle 6 is an Overhead Hoist Transfer. The number of the overhead transport vehicles 6 that the overhead transport vehicle system 1 includes is not limited to a particular number, and may be two or more. As illustrated in FIG. 1 and FIG. 2, each overhead transport vehicle 6 includes a traveler (traveling unit) 18, a transfer device 7, and a body controller (body control unit) 50.

The traveling unit 18 includes a motor to cause the overhead transport vehicle 6 to travel along the track 4. The transfer device 7 includes a body (body unit) 22, a cross-feed unit 24, a θ drive 26, a lifting drive unit 28, an elevator (lifting unit) 30, and front and rear frames 33, 33.

The body unit 22 supports the cross-feed unit 24, the θ drive 26, the lifting drive unit 28, and the lifting unit 30. The cross-feed unit 24 laterally feeds the θ drive 26, the lifting drive unit 28, and the lifting unit 30 all together in a direction orthogonal to the traveling direction of the track 4. The θ drive 26 turns at least either one of the lifting drive unit 28 and the lifting unit 30 within a predetermined angle range in a horizontal plane. The lifting drive unit 28 winds or pays out suspending members 28A such as wires, ropes, and belts, thus lifting or lowering the lifting unit 30.

The lifting unit 30 is provided with a chuck (gripper) 30A and a sensor unit 55. The chuck 30A holds a flange of a FOUP 10 in a manner supporting it from below. The chuck 30A is configured to be capable of holding or releasing the FOUP 10. The front and rear frames 33, 33 prevent the FOUP 10 from falling during transport by making claws (not illustrated) and the like not depicted appear and disappear. The front and rear frames 33, 33 are provided on the front and the rear of the overhead transport vehicle 6 in the traveling direction.

Figure 3:
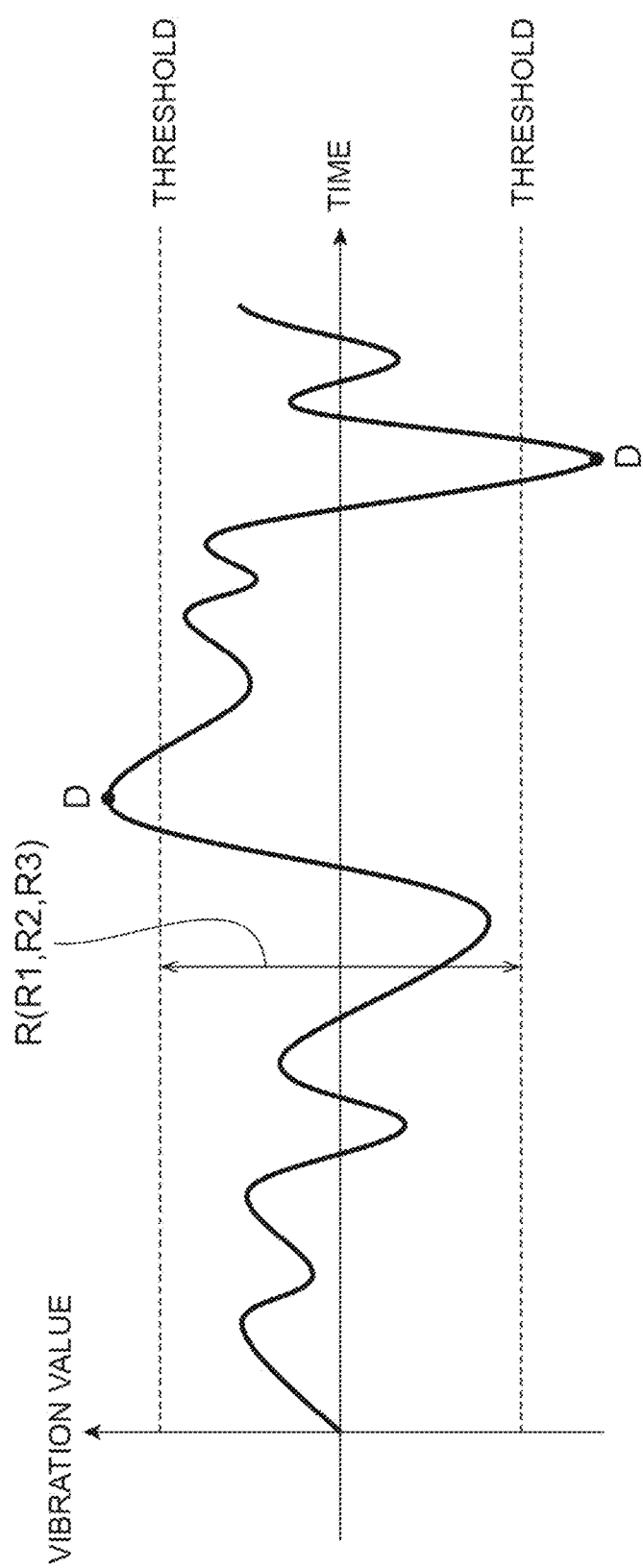
FIG. 3 is one example of a detection result of vibration detected by a vibration detection unit.

The sensor unit 55 detects vibration generated in the lifting unit 30 (i.e., vibration generated in a FOUP 10 gripped by the chuck 30A) and outputs a detection result to the body controller described later in detail. The sensor unit 55 includes a vibration detector (vibration detection unit) 55A configured to detect vibration and a vibration monitor (vibration monitoring unit) 55B. The vibration detection unit 55A is, for example, a triaxial accelerometer and detects vibrations in an X-axis direction, a Y-axis direction, and a Z-axis direction. The vibration detection unit 55A is provided at the center of gravity of the lifting unit 30 when the lifting unit 30 is viewed in plan view from the Z-axis direction. In the present preferred embodiment, the vibration detection unit 55A is provided at a position adjacent to the chuck 30A. The vibration detection unit 55A continuously detects vibrations in the X-axis direction, the Y-axis direction, and the Z-axis direction at predetermined intervals (see FIG. 3).

The vibration monitoring unit 55B determines whether a result of vibration detected by the vibration detection unit 55A is within a predetermined permissible range R and also outputs this determination result to the body controller 50. The vibration monitoring unit 55B is an electronic control unit including a central processing unit (CPU), a read only memory (ROM), and a random access memory (RAM). The vibration monitoring unit 55B can be configured, for example, as software such that a program stored in the ROM is loaded into the RAM to be executed by the CPU. The vibration monitoring unit 55B may be configured as hardware such as an electronic circuit.

The permissible range R set in the vibration monitoring unit 55B is set by the body controller 50. The vibration monitoring unit 55B of the present preferred embodiment monitors a result of vibration detected by the vibration detection unit 55A (see FIG. 3) and, only when the above-described permissible range R has been exceeded, outputs a signal indicating that the permissible range has been exceeded to the body controller 50. Specifically, at the points D indicated in FIG. 3, the vibration monitoring unit 55B outputs signals to the body controller 50 indicating that the permissible range R has been exceeded.

The vibration monitoring unit 55B outputs a determination result of vibration during traveling and a determination result of vibration during lifting or lowering of a FOUP 10 to the body controller 50. In other words, in the overhead transport vehicle 6 of the present preferred embodiment, vibration generated in the lifting unit 30 can be monitored both during traveling and during lifting or lowering.

The vibration monitoring unit 55B is able to set a plurality of the permissible ranges R. For example, in the vibration monitoring unit 55B, a permissible range R1 during traveling on a straight track, a permissible range R2 during traveling on a curved track, and a permissible range R3 during lifting or lowering of a FOUP are included. The vibration monitoring unit 55B is set such that the permissible ranges R1, R2, R3 switch depending on the operational state of the overhead transport vehicle 6.

The body controller 50 is an electronic control unit including a CPU, a ROM, and a RAM. The body controller 50 operates various operations of the respective units in the overhead transport vehicle 6 (i.e., the traveling unit 18 and the transfer device 7). Specifically, as illustrated in FIG. 2, the body controller 50 controls the traveling unit 18, the cross-feed unit 24, the θ drive 26, the lifting drive unit 28, and the lifting unit 30. The body controller 50 can be configured, for example, as software such that a program stored in the ROM is loaded into the RAM to be executed by the CPU. The body controller 50 may be configured as hardware such as an electronic circuit. The body controller 50 and the sensor unit 55 are provided in a manner capable of communicating with each other by wire or radio. For communication by wire, a communication line is incorporated in the suspending members 28A.

The body controller 50 sets the permissible ranges R for the vibration monitoring unit 55B. The body controller 50 of the present preferred embodiment sets each of the permissible range R1 during traveling on a straight track, the permissible range R2 during traveling on a curved track, and the permissible range R3 during lifting or lowering an article for the vibration monitoring unit 55B.

The body controller 50 is capable of determining the position of the overhead transport vehicle 6 by appropriate methods or devices. For example, the body controller 50 is capable of determining the position of the overhead transport vehicle 6 of itself on the basis of positional information acquired from a bar code or the like attached to the track 4 and a counter or the like of a motor, for example, included in the traveling unit 18. When having received a signal indicating that a permissible range R transmitted from the sensor unit 55 has been exceeded, the body controller 50 stores this signal and the position of the overhead transport vehicle 6 of itself in an associated manner in a memory (not illustrated), for example. In other words, the body controller 50 stores information indicating a position where vibration having exceeded the permissible range R (abnormal vibration) has been measured. The body controller 50 then transmits, to the transport controller 70, the information indicating the position where the vibration having exceeded the permissible range R has been measured in response to a request from the transport controller 70.

The transport controller 70 illustrated in FIG. 2 controls the overhead transport vehicles 6. The transport controller 70 is an electronic control unit including a CPU, a ROM, and a RAM. The transport controller 70 can be configured, for example, as software such that a program stored in the ROM is loaded into the RAM to be executed by the CPU. The transport controller 70 may be configured as hardware such as an electronic circuit. The transport controller 70 includes a transport control unit 71, a state monitoring unit 72, and a storage unit 73 that are configured by cooperative operation of hardware such as the CPU, the RAM, and the ROM and software such as a program.

The transport control unit 71 assigns carriage instructions to the overhead transport vehicles 6 on the basis of a carriage request from a host controller (not illustrated). The state monitoring unit 72 causes the body controller 50 of each overhead transport vehicle 6 to transmit information indicating a position where vibration having exceeded the permissible range R. The storage unit 73 stores a result of determination performed by the vibration monitoring unit 55B and the position thereof on the track 4 in an associated manner. Specifically, the storage unit stores information, which is transmitted from the body controller 50, indicating the position where the vibration (abnormal vibration) has exceeded the permissible range R.

Figure 5:
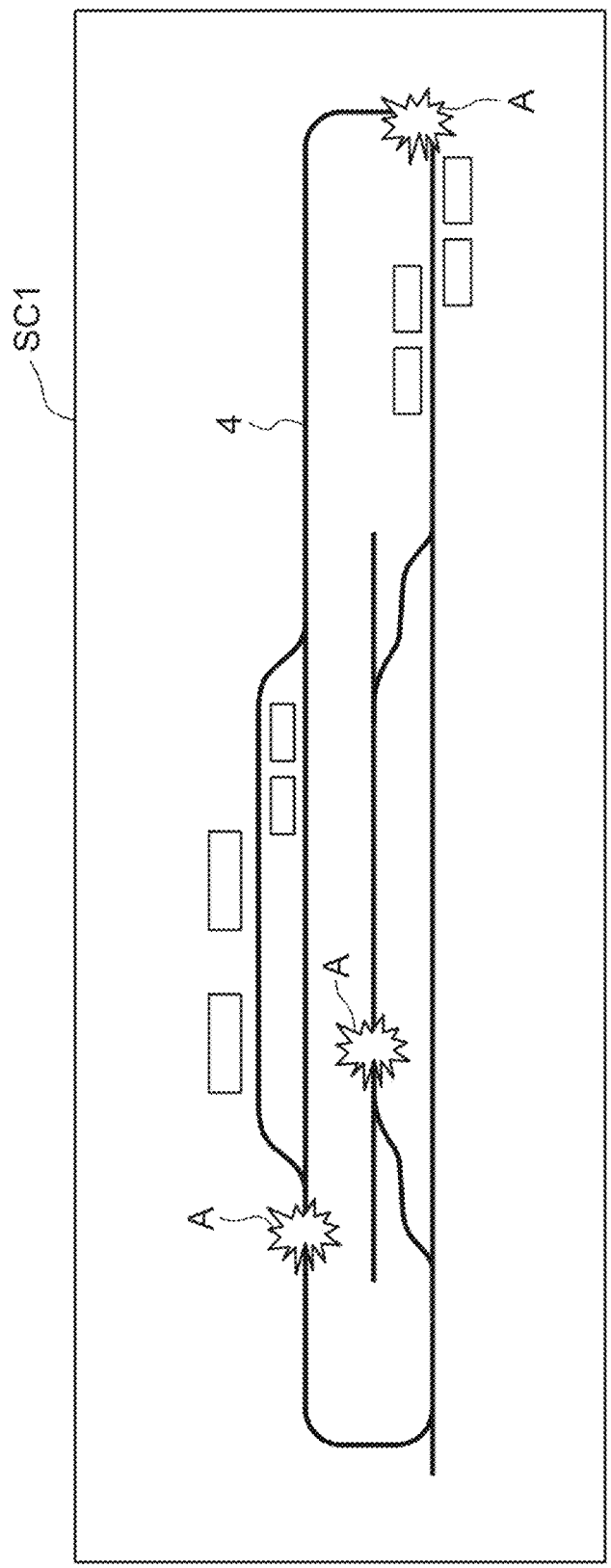
FIG. 5 is one example of a vibration monitoring screen output by a transport controller.

The state monitoring unit 72 of the present preferred embodiment outputs the information stored in the storage unit 73 to a terminal device 80. For example, the state monitoring unit 72 causes the terminal device 80 to display a vibration monitoring screen SC1 as illustrated in FIG. 5. The vibration monitoring screen SC1 is a screen in which the position A where abnormal vibration has been generated is superimposed on a plan view of arrangement of the track 4. On this track plan view of the track 4, stockers and the like (rectangular figures displayed along the track 4) are displayed in addition to the track 4.

Figure 4:
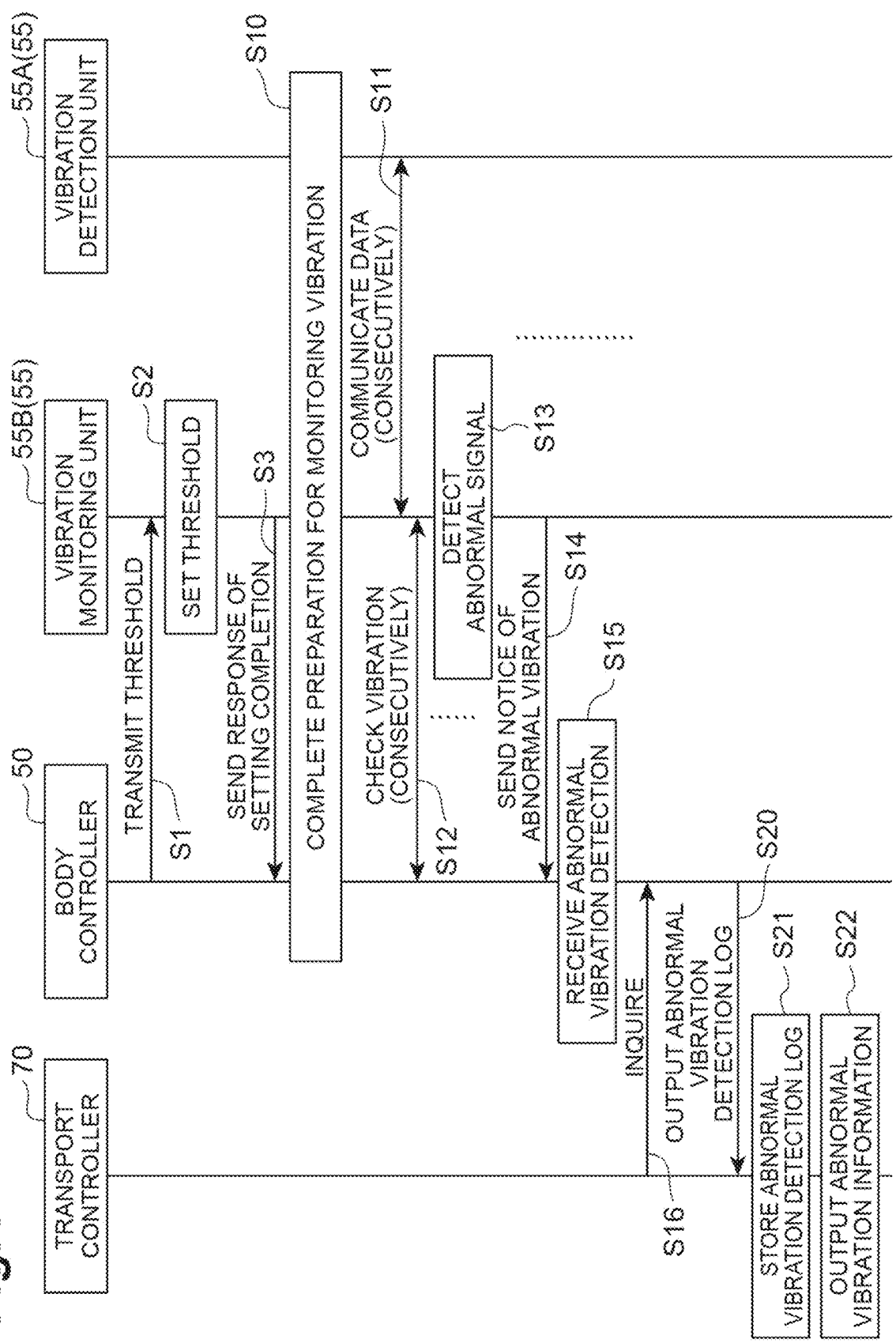
FIG. 4 is a sequence diagram illustrating flows of monitoring vibration in the overhead transport vehicle in FIG. 1.

The following describes operation of the overhead transport vehicle system 1 in the present preferred embodiment, mainly with reference to FIG. 4. To begin with, the body controller transmits a threshold for setting a permissible range R of vibration to the vibration monitoring unit 55B (step S1). The vibration monitoring unit 55B having received the threshold from the body controller 50 sets the permissible range R (threshold) (step S2). The vibration monitoring unit 55B transmits a notice of having set the permissible range R to the body controller 50 (step S3). By these processes, preparation for monitoring vibration in the sensor unit 55, that is, preparation for, when vibration detected by the vibration detection unit 55A has exceeded the permissible range R (when abnormal vibration has been detected), outputting a signal indicating this excess is completed (step S10).

When the preparation for monitoring vibration in the sensor unit 55 has been completed, the vibration detection unit 55A detects vibration generated in the lifting unit 30 at predetermined intervals. The vibration monitoring unit 55B and the vibration detection unit 55A consecutively communicate data therebetween, and the vibration monitoring unit 55B monitors vibration detected by the vibration detection unit 55A (step S11). The body controller 50 consecutively checks whether the vibration exceeds the permissible range R (step S12). Herein, when having detected that a vibration value detected by the vibration detection unit 55A has exceeded the permissible range R (step S13), the vibration detection unit 55A transmits information on this excess to the body controller 50 (step S14).

When having received a signal indicating that the permissible range R transmitted from the vibration monitoring unit 55B has been exceeded (step S15), the body controller 50 stores abnormal vibration information, in which the signal indicating this excess and the position on the track 4 are associated with each other, in a memory (not illustrated), for example. The transport controller 70 periodically inquires of the body controller 50 about the state of the overhead transport vehicle 6 (step S16). When the body controller 50 has received each of periodic inquiries from the transport controller 70, if abnormal vibration information (vibration detection log) has been stored (accumulated), the body controller 50 outputs this abnormal vibration information to the transport controller 70 (step S20).

When having received the abnormal vibration information output from the body controller 50, the transport controller 70 stores the abnormal vibration information in the storage unit 73 (step S21). The transport controller 70 then outputs the abnormal vibration information stored in the storage unit 73 to the terminal device 80 (step S22). Examples of the terminal device 80 include a display, a mobile terminal, a smart phone, and a tablet. The terminal device 80 displays the abnormal vibration information transmitted from the transport controller 70 as the vibration monitoring screen SC1 as illustrated in FIG. 5.

In each overhead transport vehicle 6 of the above-described preferred embodiment, only the result of determining whether the result of vibration detected by the vibration detection unit 55A has exceeded the predetermined permissible range R is output from the vibration monitoring unit 55B to the body controller 50. Thus, the processing load in the body controller 50 can be reduced more than in a configuration in which all of detection results detected by the sensor unit 55 are output to the body controller 50. Furthermore, in the overhead transport vehicle 6 of the present preferred embodiment, whether vibration detected by the vibration detection unit 55A is within the predetermined permissible range R is simply determined, and thus vibration generated in a FOUP 10 can be monitored with a simple configuration without performing advanced analysis and the like. Consequently, vibration generated in a FOUP 10 gripped by the lifting unit 30 can be monitored with a simple configuration without increasing processing load in the body controller 50 equipped on the overhead transport vehicle 6.

In the overhead transport vehicle 6 of the present preferred embodiment, the body controller 50 can set the permissible range R for the vibration monitoring unit 55B. By this configuration, the permissible range R for determining abnormal vibration can be easily set.

In the overhead transport vehicle 6 of the present preferred embodiment, when having determined that vibration detected by the vibration detection unit 55A has exceeded the permissible range R, the vibration monitoring unit 55B output a signal indicating this excess to the body controller 50. In this configuration, only when vibration detected by the vibration detection unit 55A has been determined to have exceeded the permissible range R, that is, only when abnormal vibration has been determined to have been detected, the vibration monitoring unit 55B outputs the signal indicating this excess to the body controller 50, and thus the processing load in the body controller 50 can be further reduced.

In the overhead transport vehicle 6 of the present preferred embodiment, the vibration monitoring unit 55B outputs, to the body controller 50, both of a result of determination on vibration during traveling and a result of determination on vibration during lifting or lowering of a FOUP 10. In this configuration, it is possible to monitor both of abnormal vibration when the overhead transport vehicle 6 is traveling and abnormal vibration when the lifting unit 30 is performing lifting or lowering operation while the overhead transport vehicle 6 stops.

In the overhead transport vehicle 6 according to the present preferred embodiment, the vibration monitoring unit 55B is able to set a plurality of permissible ranges that are switchable depending on the operational state of the overhead transport vehicle 6. In this configuration, abnormal vibration depending on the operational state of the overhead transport vehicle 6 can be suitably detected.

In the overhead transport vehicle system 1 of the present preferred embodiment, abnormal vibration (indicating that vibration has exceeded the permissible range) and the position where the abnormal vibration has been generated are stored so as to be associated with each other, and thus the location of this abnormality on the track 4 can be easily grasped. Furthermore, in the present preferred embodiment, vibration information stored in the storage unit 73 is displayed as the vibration monitoring screen SC1 as illustrated in FIG. 5, and thus information that can be visually grasped can be provided.

Although preferred embodiments of the present invention have been described above, preferred embodiments of the present invention are not limited to the preferred embodiments described above, and various modifications may be made within the scope not departing from the gist of the present invention.

In the preferred embodiments described above, examples have been described in which the permissible ranges R1, R2, R3 are set by the body controller 50. However, the number of the permissible ranges is not limited to this, and may be one, two, or four or more.

In the preferred embodiments and the modifications described above, examples have been described in which, only when vibration detected by the vibration detection unit 55A has exceeded the permissible range R, the vibration monitoring unit 55B outputs a signal indicating this excess to the body controller 50. However, the vibration monitoring unit 55B may periodically output information (signal) indicating whether the permissible range R has been exceeded to the body controller 50.

In the preferred embodiments and the modifications described above, examples have been described in which the body controller 50 can set the permissible range R for the vibration monitoring unit 55B. However, the body controller 50 may be configured to be incapable of making the setting. In this case, the permissible range R may be set in advance in the vibration monitoring unit 55B, or may be configured to be switchable by a switch, for example, provided at the vibration monitoring unit 55B.

In the preferred embodiments and the modifications above, examples have been described in which the state monitoring unit 72 configured to output information in which the determination result is superimposed on map data indicating the arrangement of the track is provided in the transport controller 70. However, an additional independent controller may be provided, and a controller having the above-described functions may be provided in at least one overhead transport vehicle 6 out of the overhead transport vehicles 6.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An overhead transport vehicle comprising:
a body capable of traveling along a track;
an elevator to ascend and descend with respect to the body and including a gripper to grip an article;
a body controller provided in the body to control portions or operations of the overhead transport vehicle;
a vibration detector provided in the elevator to detect vibration generated in the elevator; and
a vibration monitor provided in the elevator to determine whether the vibration generated in the elevator and detected by the vibration detector is within a predetermined permissible range and to output a result of the determination to the body controller.

2. The overhead transport vehicle according to claim 1, wherein the body controller is configured or programmed to set the permissible range for the vibration monitor.

3. The overhead transport vehicle according to claim 1, wherein the vibration monitor outputs a notice of excess to the body controller when vibration detected by the vibration detector has exceeded the permissible range.

4. The overhead transport vehicle according to claim 1, wherein the vibration monitor outputs, to the body controller, at least one of a result of the determination during traveling and a result of the determination during lifting or lowering of the article.

5. The overhead transport vehicle according to claim 1, wherein the vibration monitor is able to set a plurality of permissible ranges that are switchable depending on an operational state of the overhead transport vehicle.

6. An overhead transport vehicle system comprising:
a plurality of the overhead transport vehicles according to claim 1; and
a state monitor capable of communicating with the body controller of each of the overhead transport vehicles; wherein
the state monitor stores therein a result of the determination and a position on the track in an associated manner and outputs information in which the result of the determination is superimposed on map data representing an arrangement of the track.

7. The overhead transport vehicle according to claim 2, wherein the vibration monitor outputs a notice of excess to the body controller when vibration detected by the vibration detector has exceeded the permissible range.

8. The overhead transport vehicle according to claim 2, wherein the vibration monitor is able to set a plurality of permissible ranges that are switchable depending on an operational state of the overhead transport vehicle.

9. The overhead transport vehicle according to claim 3, wherein the vibration monitor is able to set a plurality of permissible ranges that are switchable depending on an operational state of the overhead transport vehicle.

10. The overhead transport vehicle according to claim 7, wherein the vibration monitor is able to set a plurality of permissible ranges that are switchable depending on an operational state of the overhead transport vehicle.

11. An overhead transport vehicle system comprising:
a plurality of the overhead transport vehicles according to claim 2; and
a state monitor capable of communicating with the body controller of each of the overhead transport vehicles; wherein
the state monitor stores therein a result of the determination and a position on the track in an associated manner and outputs information in which the result of the determination is superimposed on map data representing an arrangement of the track.

12. An overhead transport vehicle system comprising:
a plurality of the overhead transport vehicles according to claim 3; and
a state monitor capable of communicating with the body controller of each of the overhead transport vehicles; wherein
the state monitor stores therein a result of the determination and a position on the track in an associated manner and outputs information in which the result of the determination is superimposed on map data representing an arrangement of the track.

13. An overhead transport vehicle system comprising:
a plurality of the overhead transport vehicles according to claim 4; and
a state monitor capable of communicating with the body controller of each of the overhead transport vehicles; wherein
the state monitor stores therein a result of the determination and a position on the track in an associated manner and outputs information in which the result of the determination is superimposed on map data representing an arrangement of the track.

14. An overhead transport vehicle system comprising:
a plurality of the overhead transport vehicles according to claim 5; and
a state monitor capable of communicating with the body controller of each of the overhead transport vehicles; wherein
the state monitor stores therein a result of the determination and a position on the track in an associated manner and outputs information in which the result of the determination is superimposed on map data representing an arrangement of the track.

15. An overhead transport vehicle system comprising:
a plurality of the overhead transport vehicles according to claim 7; and
a state monitor capable of communicating with the body controller of each of the overhead transport vehicles; wherein
the state monitor stores therein a result of the determination and a position on the track in an associated manner and outputs information in which the result of the determination is superimposed on map data representing an arrangement of the track.

16. An overhead transport vehicle system comprising:
a plurality of the overhead transport vehicles according to claim 8; and
a state monitor capable of communicating with the body controller of each of the overhead transport vehicles; wherein
the state monitor stores therein a result of the determination and a position on the track in an associated manner and outputs information in which the result of the determination is superimposed on map data representing an arrangement of the track.

17. An overhead transport vehicle system comprising:
a plurality of the overhead transport vehicles according to claim 9; and
a state monitor capable of communicating with the body controller of each of the overhead transport vehicles; wherein
the state monitor stores therein a result of the determination and a position on the track in an associated manner and outputs information in which the result of the determination is superimposed on map data representing an arrangement of the track.

18. An overhead transport vehicle system comprising:
a plurality of the overhead transport vehicles according to claim 10; and
a state monitor capable of communicating with the body controller of each of the overhead transport vehicles; wherein
the state monitor stores therein a result of the determination and a position on the track in an associated manner and outputs information in which the result of the determination is superimposed on map data representing an arrangement of the track.

* * * * *